US012751200B2

(12) United States Patent
Grancini et al.

(10) Patent No.: US 12,751,200 B2
(45) Date of Patent: Sep. 29, 2026

(54) PROCESS FOR THE PREPARATION OF PEROVSKITE-BASED INKS

(71) Applicant: ENI S.P.A., Rome (IT)

(72) Inventors: Giulia Grancini, Tortona (IT); Riccardo Montecucco, Pavia (IT); Eleonora Quadrivi, Novara (IT)

(73) Assignee: SUNXT S.R.L., Rome (IT)

( * ) Notice: Subject to any disclaimer, the term of this patent is extended or adjusted under 35 U.S.C. 154(b) by 0 days.

(21) Appl. No.: 19/102,661

(22) PCT Filed: Aug. 2, 2023

(86) PCT No.: PCT/IB2023/057823

§ 371 (c)(1),
(2) Date: Feb. 10, 2025

(87) PCT Pub. No.: WO2024/033755

PCT Pub. Date: Feb. 15, 2024

(65) Prior Publication Data

US 2026/0059999 A1 Feb. 26, 2026

(30) Foreign Application Priority Data

Aug. 9, 2022 (IT) ........................ 102022000017004

(51) Int. Cl.

| | |
|---|---|
| ***H10K 85/50*** | (2023.01) |
| ***H10K 71/13*** | (2023.01) |
| ***H10K 71/40*** | (2023.01) |
| ***H10K 71/60*** | (2023.01) |
| *H10K 30/50* | (2023.01) |

(52) U.S. Cl.

CPC ........... *H10K 85/50* (2023.02); *H10K 71/135* (2023.02); *H10K 71/40* (2023.02); *H10K 71/60* (2023.02); *H10K 30/50* (2023.02)

(58) Field of Classification Search

CPC ...... H10K 85/50; H10K 71/60; H10K 71/135; H10K 71/40

See application file for complete search history.

(56) References Cited

FOREIGN PATENT DOCUMENTS

| | | | | |
|---|---|---|---|---|
| CN | 109360895 A | * | 2/2019 | ............. H10K 71/12 |
| CN | 111129319 A | * | 5/2020 | ........... C07C 257/12 |
| CN | 113346025 A | | 9/2021 | |

OTHER PUBLICATIONS

Jiang et al., "CsPbBrxI3-x thin films with multiple ammonium ligands for low turn-on pure-red perovskite light-emitting diodes", Nano Research, 2021, 14(1): 191-197. (Year: 2021).*

(Continued)

*Primary Examiner* — Tae-Sik Kang
(74) *Attorney, Agent, or Firm* — CANTOR COLBURN LLP

(57) ABSTRACT

A process for preparing a perovskite-based ink, the perovskite having general formula _$CsPbI_{3-y}Br_y$, (I)

Figure 1:
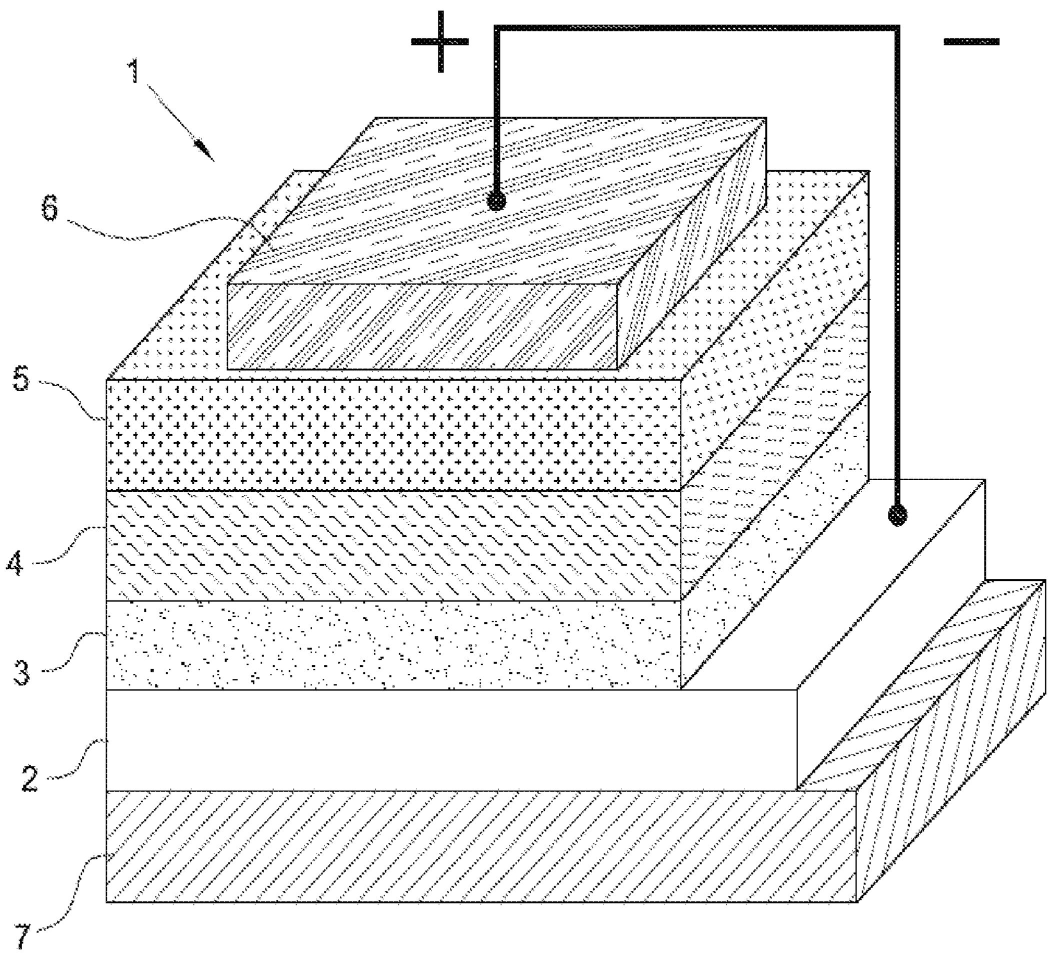

wherein y is between 00.2, including the following steps:

(a) dissolving lead iodide ($PbI_2$) in at least one organic solvent, obtaining a first solution;

(b) dissolving cesium iodide (CsI) and at least one ammonium salt having general formula:

_$R_xH_{4-x}NI$, (II)

wherein R represents a linear or branched $C_1$-$C_4$ alkyl group, in a part of the first solution, obtaining a second solution;

(Continued)

(c) dissolving cesium iodide (CsI) and at least one ammonium salt having general formula:

$$\_R_xH_{4-x}NBr, \tag{III}$$

wherein R represents a linear or branched $C_1$-$C_4$ alkyl group, obtaining a third solution;

(d) mixing the second solution with the third solution obtaining a perovskite-based ink;

wherein in step (d) the molar ratio between the at least one ammonium salt and the at least one ammonium salt is between 0:100 and 50:50.

9 Claims, 7 Drawing Sheets

(56) References Cited

OTHER PUBLICATIONS

Ning et al., CN 109360895 A, English Machine Translation. (Year: 2019).*

Zhao et al., CN 111129319 A, English Machine Translation. (Year: 2020).*

Ma et al., "Oxidization-Free Spiro-OMeTAD Hole-Transporting Layer for Efficient CsPbl2Br Perovskite Solar Cells", CS Appl. Mater. Interfaces 2020, 12, 52779-52787. (Year: 2020).*

International Search Report and Written Opinion for Application No. PCT/IB2023/057823, dated Oct. 25, 2023, 11 pages.

Jiang et al: "CsPbBrlthin films with multiple ammonium ligands for low turn-on pure-red perovskite light-emitting diodes" Nano Research, vol. 14, No. 1, Sep. 26, 2020, pp. 191-197.

Pica et al., "A step beyond in steady-state and timeresolvedelectro-optical spectroscopy: Demonstration of a customizedsimple, compact, low-cost, fiber-based interferometer system" Structural Dynamics (2022), vol. 9, 011101, 8 pages.

Wang et al., "Composition manipulation boosts the efficiency of carbon-based CsPbl3 perovskite solar cells to beyond 14%" Nano Energy (2021), vol. 84, 105881, 9 pages.

Wang et al., "The Role of Dimethylammonium lodide in CsPbl3 Perovskite Fabrication: Additive or Dopant?" Angewante Chemie (2019), vol. 58, Issue 46, p. 16691-16696.

* cited by examiner

PROCESS FOR THE PREPARATION OF PEROVSKITE-BASED INKS

CROSS-REFERENCE TO RELATED APPLICATIONS

This application is a 35 U.S.C. § 371 National Stage patent application of PCT/IB2023/057823 filed on 2 Aug. 2023, which claims the benefit of Italian patent application 102022000017004, filed on 9 Aug. 2022, the disclosures of which are incorporated herein by reference in their entirety.

TECHNICAL FIELD

The present disclosure relates to a process for the preparation of perovskite-based inks.

More specifically, the present disclosure relates to a process for the preparation of a perovskite-based ink, said perovskite having general formula (I):

$$CsPbI_{3-y}Br_y \quad (I)$$

wherein y is a number comprised between 0 and 0.2, preferably comprised between 0.05 and 0.1, wherein solutions of precursors of said perovskite comprising cesium iodide, lead iodide, at least one ammonium salt having the general formula (II) below reported and at least one ammonium salt having the general formula (III) below reported, are used, said at least one ammonium salt having general formula (II) and at least one ammonium salt having general formula (III) being used in molar ratio comprised between 0:100 and 50:50.

Said perovskite-based ink can be advantageously used in optoelectronic applications, in particular, in perovskite-based photovoltaic cells (or solar cells), in light emitting diodes (LEDs), in X-ray sensors, in photodetectors.

The present disclosure also relates to a process for the preparation of a perovskite-based film comprising the following steps: (i) depositing the perovskite-based ink obtained according to the process object of the present disclosure on a substrate to form a film; (ii) subjecting said substrate to thermal treatment (annealing) at a temperature comprised between 120° C. and 190° C., preferably comprised between 135° C. and 185° C.

BACKGROUND

In recent years, the need to reduce carbon dioxide ($CO_2$) emissions for sustainable development has contributed to making photovoltaic (or solar) a leading solution as an alternative energy source to fossil fuels. However, the market today is dominated by low-cost and efficient, but highly energy-intensive solutions for energy-intensive manufacturing processes. For this reason, research has focused on the development of new semiconductor materials that can be efficient, low-cost and with low environmental impact at the same time.

In the last ten years, in particular, new semiconductor materials based on hybrid organic-inorganic compounds called hybrid perovskites have emerged.

Hybrid perovskites, more commonly identified in the class of organic-inorganic hybrid perovskites and historically represented by lead methylammonium triiodide ($CH_3NH_3PbI_3$), possess excellent optoelectronic properties, among which the high absorption coefficient, the possibility of easily modulate the band gap, tolerance to structural defects, high diffusion length of charge carriers.

Photovoltaic cells (or solar cells) based on organic-inorganic hybrid perovskite have shown an exponential growth in terms of energy conversion efficiency [Power Conversion Efficiency—(PCE)] reaching, in the case of a single junction photovoltaic cells (or solar cells) a value of energy conversion efficiency [Power Conversion Efficiency—(PCE)] equal to 25.6%, surpassing the more mature photovoltaic technologies (or solar technologies). Said photovoltaic cells (or solar cells) based on organic-inorganic hybrid perovskite are formed by a series of superimposed thin layers, wherein the organic-inorganic perovskite is inserted between two charge-transport layers, i.e. between a layer based on a hole transport material (Hole Transport Layer—HTL) and a layer based on an electron transport material (Electron Transport Layer—ETL). At the opposite ends of these photovoltaic cells (or solar cells) based on organic-inorganic hybrid perovskites we find on one side a glass substrate covered with a transparent and conductive oxide and on the opposite side a metal contact known as back contact.

Another class of perovskites suitable for use in optoelectronic devices and in photovoltaic (or solar) is that of inorganic perovskites, wherein the organic part is replaced by an inorganic element such as cesium (Cs), which show greater thermal stability compared to hybrid perovskites, mainly due to the absence of volatile and hygroscopic organic cations. Among the main materials belonging to this class, cesium lead triiodide ($CsPbI_3$) has been developed, which allows to reach energy conversion efficiency values [Power Conversion Efficiency—(PCE)] higher than 20% when used in the photoactive layer in photovoltaic (or solar) cells in a so-called "direct" configuration, suitably modified by inserting additional layers. However, a strong limit to the use of said material is represented by the high annealing temperature to which the photoactive layer comprising it is subjected: this, not only represents an energy-intensive process, but also limits the field of applicability of cesium lead triiodide ($CsPbI_3$) inside the photovoltaic cells (or solar cells). In fact, the layer based on an electron transport material (Electron Transport Layer—ETL) placed under the photoactive layer comprising cesium lead triiodide ($CsPbI_3$) must withstand, without degrading, a temperature of 210° C., the most commonly used for the thermal treatment (annealing) of said photoactive layer.

Photovoltaic cells (or solar cells) are divided into two categories, those in direct or "n-i-p" configuration and those in inverted or "p-i-n" configuration.

Photovoltaic cells in direct or "n-i-p" configuration are those having the layer based on an electron transport material (Electron Transport Layer—ETL) placed under the photoactive layer comprising the perovskite above which is placed the layer based on a hole transport material (Hole Transport Layer—HTL). On the contrary, in the cells in inverted configuration or "p-i-n" the layer placed under the photoactive layer comprising the perovskite is the layer based on a hole transport material (Hole Transport Layer—HTL) while above the photoactive layer is placed the layer based on an electron transport material (Electron Transport Layer—ETL).

Generally, the photovoltaic cells (or solar cells) having a photoactive layer comprising cesium lead triiodide ($CsPbI_3$) reported in the literature are those having a direct or "n-i-p" configuration and more specifically comprise the following layers: (i) a glass substrate covered with a layer of transparent and conductive oxide (Transparent Conductive Oxide—TCO); (ii) layer based on an electron transport material (Electron Transport Layer—ETL) generally a compact layer of titanium dioxide (c-$TiO_2$); (iii) optionally, a mesoporous titanium dioxide ($TiO_2$) scaffold that has the purpose of providing a greater interface area with the perovskite by increasing the electron collection efficiency; (iv) a photoactive layer comprising cesium lead triiodide ($CsPbI_3$); (v) a layer based on a hole transport material (Hole Transport Layer—HTL) generally a layer of spiro—OMeTAD ($N^2$,$N^2$,$N^{2'}$,$N^{2'}$,$N^7$,$N^7$,$N^{7'}$,$N^{7'}$-octakis(4-methoxyphenyl)-9,9'-spirobi[9H-fluorene]-2,2',7,7'-tetramine); (vi) a metallic contact known as back contact which constitutes the cathode, generally a metallic layer of gold, silver or copper. In order to protect them from atmospheric agents and for use in real conditions, these photovoltaic cells (or solar cells) are generally encapsulated with glass.

Cesium lead triiodide ($CsPbI_3$) has four crystalline phases, divided into two main groups. The first group, which of the so-called black phases, contains the phase indicated by the Greek letter alpha, belonging to the cubic system, the beta phase, belonging to the tetragonal system and the gamma phase, belonging to the orthorhombic system. These phases have a band gap of about 1.7 eV, and are suitable for use as an active material in perovskite-based photovoltaic cells (or solar cells): for this reason they are often called photoactive phases. The second group instead contains the so-called yellow phase indicated with the Greek letter delta, belonging to the orthorhombic system and having a band gap equal to 2.95 eV and, precisely because of the high band gap, is not used in perovskite-based photovoltaic cells (or solar cells).

Methods of deposition of one of the above photoactive phases of the cesium lead triiodide ($CsPbI_3$) are known in the art.

Generally, cesium lead triiodide ($CsPbI_3$) deposition process is carried out by spin coating a precursor solution of cesium lead triiodide ($CsPbI_3$), prepared by dissolving lead iodide ($PbI_2$) and cesium iodide (CsI) in organic solvents such as, for example, dimethylformamide (DMF) and dimethyl sulfoxide (DMSO). The obtained thin film following the deposition must be thermally treated (annealing) in order to remove the solvents and to allow the nucleation of the crystalline grains of the cesium lead triiodide ($CsPbI_3$). In order to obtain more performing photovoltaic cells (or solar cells), hydrogen iodide (HI) is often added to the mixture of lead iodide ($PbI_2$) and cesium iodide (CsI), which reacts with dimethylformamide (DMF) by hydrolyzing it and producing dimethylammonium iodide (DMAI). This compound, added to the mixture or synthesized in situ in suitable quantities, allows the deposition and stabilization of the beta phase of cesium lead triiodide ($CsPbI_3$), which allows to obtain efficiencies higher than 16% for cells in direct configuration. The thin film obtained from the deposition of said mixture is then subjected to thermal treatment (annealing), at 210° C., for 5 minutes: said thermal treatment (annealing) allows the dissolved precursors to be converted into dimethylammonium lead triiodide ($DMAPbI_3$) and lead cesium hexaidodide ($Cs_4PbI_6$), a low-dimensional perovskite. Subsequently, these two compounds combine thanks to the high temperatures of the thermal treatment (annealing) forming cesium lead triiodide ($CsPbI_3$) with the removal of dimethylammonium iodide (DMAI) in gaseous form (see Scheme 1 below):

Scheme 1

$$CsI + PbI_2 + xDMAI \longrightarrow DMAPbI_3 + Cs_4PbI_6 \longrightarrow CsPbI_3 + DMAI$$

More details regarding the above process can be found, for example, in the following articles by Whang Y. et al., in "Angewante Chemie" (2019), Vol. 58, Issue 46, pg. 16691-16696 and Wang H. et al., in "Nano Energy" (2021), Vol. 84, 105881.

As reported above, perovskite-based photovoltaic cells (or solar cells) that have a photoactive layer comprising cesium lead triiodide ($CsPbI_3$) are those having a direct or "n-i-p" configuration wherein the layer based on a hole transport material (Hole Transport Layer—HTL) is generally a layer of spiro-OMeTAD ($N^2$,$N^2$,$N^{2'}$,$N^{2'}$,$N^7$,$N^7$,$N^{7'}$,$N^{7'}$-octakis(4-methoxyphenyl)-9,9'-spirobi[9H-fluorene]-2,2',7,7'-tetramine) and the layer based on an electron transport material (Electron Transport Layer—ETL) is generally a compact layer of titanium dioxide (c-$TiO_2$). The choice of the compact layer of titanium dioxide (c-$TiO_2$) as electron carrier lies, among other reasons, in its ability to resist the temperature of 210° C. without degrading its optoelectronic properties.

However, the need to use energy-intensive processes such as thermal treatments (annealing) at high temperatures (i.e. 210° C.) to stabilize the photoactive phase of cesium lead triiodide ($CsPbI_3$) limits the use of said perovskite in industrial field and in applications such as, for example, flexible electronics, where lower process temperatures are required. Furthermore, it should also be kept in mind that in perovskite-based photovoltaic cells (or solar cells) which have a photoactive layer comprising cesium lead triiodide ($CsPbI_3$) having a direct or "n-i-p" configuration, the material most used for the layer based on an electron transport material (Electron Transport Layer—ETL) is titanium dioxide ($TiO_2$) which, however, requires a thermal treatment (annealing) at 450° C. to stabilize the phase suitable for the transport of electrons: this process is particularly expensive and difficult to exploit in the industrial field.

SUMMARY

Consequently, in order to overcome the drawbacks reported above, the development of a process which allows to stabilize the black phases at a lower temperature for the deposition of the layer of cesium lead triiodide ($CsPbI_3$) can pave the way for the use of alternative electron transport materials such as, for example, tin oxide ($SnO_2$), if the direct or "n-i-p" configuration is considered, or of hole transport materials such as, for example, acid [2-(3,6-dimethoxy-9H-carbazol-9-yl)ethyl]phosphonic (MeO-2PACz), if an inverted configuration or "p-i-n" is considered, which are processed at low temperatures and therefore allow for greater exploitation in the industrial field and in applications such as, for example, flexible electronics.

The Applicant has therefore posed the problem of finding a process for the preparation of a perovskite-based ink, wherein said perovskite is cesium lead triiodide ($CsPbI_3$), which allows stabilizing its photoactive phases at lower temperatures than those normally used.

The Applicant has found a process for the preparation of a perovskite-based ink, wherein said perovskite is cesium lead triiodide ($CsPbI_3$), wherein solutions of precursors of said cesium lead triiodide ($CsPbI_3$) comprising cesium iodide, lead iodide, dimethylammonium iodide (DMAI) and dimethylammonium bromide (DMABr), said dimethylammonium iodide (DMAI) and dimethylammonium bromide (DMABr) being used in a molar ratio between 0:100 and 50:50. The perovskite-based thin films obtained through said process are subjected to thermal treatments (annealing), in order to obtain the photoactive phases of the perovskite, at temperatures lower than 210° C. thus allowing greater exploitation in the industrial field and in applications such as, for example, flexible electronics. Said perovskite-based ink can be advantageously used in optoelectronic applications, in particular, in perovskite-based photovoltaic cells (or solar cells), in light emitting diodes (LEDs), in X-ray sensors, in photodetectors.

It is therefore an object of the present disclosure a process for preparing a perovskite-based ink, said perovskite having general formula (I):

$$CsPbI_{3-y}Br_y \quad (I)$$

wherein y is a number comprised between 0 and 0.2, preferably comprised between 0.05 and 0.1;

comprising the following steps:

(a) dissolving lead iodide ($PbI_2$) in at least one organic solvent selected from dimethyl sulfoxide (DMSO), dimethylformamide (DMF), γ-butyrolactone (GBL), γ-valerolactone (GVL), or mixtures thereof, preferably dimethyl sulfoxide (DMSO), dimethylformamide (DMF), or mixtures thereof, obtaining a first solution;

(b) dissolving cesium iodide (CsI) and at least one ammonium salt having general formula (II):

$$R_xH_{4-x}NI \quad (II)$$

wherein R represents a linear or branched $C_1$-$C_4$ alkyl group, preferably a methyl group and x is an integer comprised between 2 and 4, preferably 2, in a part of said first solution obtained in step (a), obtaining a second solution;

(c) dissolving cesium iodide (CsI) and at least one ammonium salt having general formula (III):

$$R_xH_{4-x}NBr \quad (III)$$

wherein R represents a linear or branched $C_1$-$C_4$ alkyl group, preferably a methyl group and x is an integer comprised between 2 and 4, preferably 2, in a part of said first solution obtained in step (a), obtaining a third solution;

(d) mixing said second solution obtained in step (b) with said third solution obtained in step (c) obtaining a perovskite-based ink;

characterized in that in said step (d) the molar ratio between said at least one ammonium salt having general formula (II) and said at least one ammonium salt having general formula (III) is comprised between 0:100 and 50:50.

For the purpose of the present description and of the following claims, the definitions of the numerical ranges always comprise the extremes unless otherwise specified.

For the purposes of the present description and of the following claims, the term "comprising" also comprises the terms "consisting essentially of" or "consisting of".

According to a preferred embodiment of the present disclosure, said at least one ammonium salt having general formula (II) is dimethylammonium iodide (DMAI).

According to a preferred embodiment of the present disclosure, said at least one ammonium salt having general formula (III) is dimethylammonium bromide (DMABr).

According to a preferred embodiment of the present disclosure, said step (a) can be carried out at a temperature comprised between 30° C. and 80° C., preferably comprised between 40° C. and 70° C.

According to a preferred embodiment of the present disclosure, said step (a) can be carried out for a time comprised between 1 hour and 12 hours, preferably comprised between 4 hours and 11 hours.

According to a preferred embodiment of the present disclosure, said step (b) can be carried out at a temperature comprised between 15° C. and 35° C., preferably comprised between 20° C. and 30° C., more preferably at room temperature (25° C.).

According to a preferred embodiment of the present disclosure, said step (b) can be carried out for a time comprised between 5 minutes and 2 hours, preferably comprised between 10 minutes and 1 hour.

According to a preferred embodiment of the present disclosure, said step (c) can be carried out at a temperature comprised between 15° C. and 35° C., preferably comprised between 20° C. and 30° C., more preferably at room temperature (25° C.).

According to a preferred embodiment of the present disclosure, said step (c) can be carried out for a time comprised between 5 minutes and 2 hours, preferably comprised between 10 minutes and 1 hour.

According to a preferred embodiment of the present disclosure, said step (d) can be carried out at a temperature comprised between 15° C. and 35° C., preferably comprised between 20° C. and 30° C., more preferably at room temperature (25° C.).

According to a preferred embodiment of the present disclosure, said step (d) can be carried out for a time comprised between 5 minutes and 2 hours, preferably comprised between 8 minutes and 1 hour.

The present disclosure also relates to a process for preparing a perovskite film comprising the following steps: (i) depositing the perovskite-based ink obtained according to the process object of the present disclosure on a substrate to form a film; (ii) subjecting said substrate to thermal treatment (annealing) at a temperature comprised between 120° C. and 190° C., preferably comprised between 135° C. and 185° C.

The deposition of the perovskite-based ink on the substrate can be carried out according to deposition techniques known in the art such as, for example, spin-coating, slot die coating, blade coating, screen printing, spray-coating, ink-jet printing, gravure printing, spray pyrolysis.

As reported above, the perovskite-based ink obtained through the process object of the present disclosure can be advantageously used in perovskite-based photovoltaic cells (or solar cells).

Accordingly, a further object of the present disclosure is a process for the preparation of a perovskite-based photovoltaic cell (or solar cell) comprising the following steps:

($a_1$) preparing a glass substrate covered with a layer of transparent and conductive oxide (Transparent Conductive Oxide—TCO) (anode) [for example, a layer of indium tin oxide (Indium Tin Oxide—ITO) or fluorine-doped tin oxide ($SnO_2$:F) (Fluorine-doped Tin Oxide—TO)];

($b_1$) depositing a layer based on an electron transport material (Electron Transport Layer—ETL) (for example, a compact layer of titanium dioxide (c-$TiO_2$), on the photoactive layer obtained in said step ($a_1$);

($c_1$) optionally, depositing on the layer based on an electron transport material (Electron Transport Layer—ETL) obtained in said step ($b_1$), a layer based on a mesoporous oxide (scaffold);

($d_1$) depositing the perovskite-based ink obtained with the process object of the present disclosure on the layer based on an electron transport material (Electron Transport Layer—ETL) obtained in said step ($b_1$), or on the layer based on a mesoporous oxide (scaffold) obtained in said step ($c_1$), obtaining a photoactive layer;

($e_1$) depositing a layer based on a hole transport material (Hole Transport Layer—HTL) (for example, a layer of spiro-OMeTAD ($N^2$,$N^2$,$N^{2'}$,$N^{2'}$,$N^7$,$N^7$,$N^{7'}$,$N^{7'}$-octakis (4-methoxyphenyl)-9,9'-spirobi[9H-fluorene]-2,2',7,7'-tetramine) on the photoactive layer obtained in said step ($d_1$);

($f_1$) depositing a metallic contact known as back contact which constitutes the cathode (for example, a metallic layer of gold, silver or copper, or a layer of graphene derivatives such as, for example, a layer of nanowire of silver) on the layer based on a hole transport material (Hole Transport Layer—HTL) obtained in said step ($e_1$);

wherein said step ($d_1$) is carried out at a temperature comprised between 120° C. and 190° C., preferably comprised between 135° C. and 185° C.

For the purpose of the above process, said steps ($b_1$), ($c_1$), ($d_1$) and ($e_1$), can be carried out according to deposition techniques known in the art such as, for example, spin-coating, slot die coating, blade coating, screen printing, spray-coating, ink-jet printing, gravure printing, spray pyrolysis.

For the purpose of the above process, said step ($f_1$) can be carried out according to techniques known in the art such as, for example, evaporation, sputtering, electron beam assisted deposition, sputtering, spin coating, gravure printing, flexographic printing, slot die coating.

DETAILED DESCRIPTION

The present disclosure will now be illustrated in greater detail through an embodiment with reference to FIG. 1 below reported.

In particular, FIG. 1 represents a cross-sectional view of a perovskite-based photovoltaic cell (or solar cell) in direct configuration or "n-i-p" (1) comprising the following layers: a glass substrate (7) covered by a layer of transparent and conductive oxide (Transparent Conductive Oxide—TCO) (anode) [e.g., indium tin oxide (Indium Tin Oxide—ITO) or fluorine-doped tin oxide ($SnO_2$:F) (Fluorine-doped Tin Oxide—FTO)] (2); a layer based on an electron transport material (Electron Transport Layer—ETL) (e.g., a compact layer of titanium dioxide (c-$TiO_2$)] (3); optionally a scaffold of mesoporous titanium dioxide ($TiO_2$) which has the purpose of providing a greater interface area with the perovskite by increasing the electron collection efficiency (not represented in FIG. 1); a photoactive layer comprising the perovskite-based ink obtained through the object process of the present disclosure (4); a layer based on a hole transport material (Hole Transport Layer—HTL) [e.g., a layer of spiro-OMeTAD ($N^2$,$N^2$,$N^{2'}$,$N^{2'}$,$N^7$,$N^7$,$N^{7'}$,$N^{7'}$-octakis(4-methoxyphenyl)-9,9'-spirobi[9H-fluorene]-2,2',7,7'-tetramine] (5); a metallic contact known as back contact which constitutes the cathode [e.g., a metallic layer of gold, silver or aluminum] (6).

In order to better understand the present disclosure and to put it into practice, some illustrative and non-limiting examples of the same are below reported.

In the following examples, for greater simplicity, the term solar cell is used, which is to be understood as having the same meaning as photovoltaic cell.

Example 1 (Comparative)

Preparation of a Perovskite-Based Ink Containing Dimethylammonium Iodide (DMAI) and Dimethylammonium Bromide (DMABr) in a Molar Ratio of 75:25

655 mg of lead iodide (TCI—Tokyo Chemical Industries) (1.421 mol) and 1.4764 mL of a mixture of dimethylformamide (DMF) (Merck) and dimethyl sulfoxide (DMSO) (Merck) in a ratio of 4:1 (v/v) were introduced into a 4 mL vial: the obtained solution was stirred on a heating plate, at a temperature of 60° C., for 10 hours, obtaining a first solution. Subsequently, 112 mg of cesium iodide (TCI—Tokyo Chemical Industries) (0.431 mol) and 74.6 mg of dimethylammonium iodide (DMAI) (Merck) (0.431 mol), previously weighed inside a 1.5 mL vial, and 479 μL of said first solution were introduced into a 4 mL vial: the obtained solution was stirred on a plate, at room temperature (25° C.), for 30 minutes, obtaining a second solution. Subsequently, 237 mg of cesium iodide (TCI—Tokyo Chemical Industries) (0.912 mol) and 80.5 mg of dimethylammonium bromide (DMABr) (Greatcell Solar Materials) (0.639 mol), previously weighed inside a 1.5 mL vial, and 1.0136 mL of said first solution were introduced into a 4 mL vial: the obtained solution was stirred on a plate, at room temperature (25° C.), for 30 minutes, obtaining a third solution. Subsequently, 267 L of said second solution containing dimethylammonium iodide (DMAI) and 127.2 μL of said third solution containing dimethylammonium bromide (DMABr) were introduced into a 4 mL vial: the whole was mixed using a magnetic stirrer, at room temperature (25° C.), for 10 minutes, obtaining a perovskite-based ink containing dimethylammonium iodide (DMAI) and dimethylammonium bromide (DMABr) in a molar ratio of 75:25.

Example 2 (Disclosure)

Preparation of a Perovskite-Based Ink Containing Dimethylammonium Iodide (DMAI) and Dimethylammonium Bromide (DMABr) in a Molar Ratio of 50:50

655 mg of lead iodide (TCI—Tokyo Chemical Industries) (1.421 mol) and 1.4764 mL of a mixture of dimethylformamide (DMF) (Merck) and dimethyl sulfoxide (DMSO) (Merck) in a ratio of 4:1 (v/v) were introduced into a 4 mL vial: the obtained solution was stirred on a heating plate, at a temperature of 60° C., for 10 hours, obtaining a first solution. Subsequently, 112 mg of cesium iodide (TCI—Tokyo Chemical Industries) (0.431 mol) and 74.6 mg of dimethylammonium iodide (DMAI) (Merck) (0.431 mol), previously weighed inside a 1.5 mL vial, and 479 μL of said first solution were introduced into a 4 ml vial: the obtained solution was stirred on a plate, at room temperature (25° C.), for 30 minutes, obtaining a second solution. Subsequently, 237 mg of cesium iodide (TCI—Tokyo Chemical Industries) (0.912 mol) and 80.5 mg of dimethylammonium bromide (DMABr) (Greatcell Solar Materials) (0.639 mol), previously weighed inside a 1.5 mL vial, and 1.0136 mL of said first solution were added to a 4 mL vial: the obtained solution was stirred on a plate, at room temperature (25° C.), for 30 minutes, obtaining a third solution. Subsequently, 161.6 μL of said second solution containing dimethylammonium iodide (DMAI) and 230.9 μL of said third solution containing dimethylammonium bromide (DMABr) were introduced into a 4 mL vial: the whole was mixed by means of a magnetic stirrer, at room temperature (25° C.), for 10 minutes, obtaining a perovskite-based ink containing dimethylammonium iodide (DMAI) and dimethylammonium bromide (DMABr) in a molar ratio of 50:50.

Example 3 (Disclosure)

Preparation of a Perovskite-Based Ink Containing Dimethylammonium Iodide (DMAI) and Dimethylammonium Bromide (DMABr) in a Molar Ratio of 25:75

655 mg of lead iodide (TCI—Tokyo Chemical Industries) (1.421 mol) and 1.4764 mL of a mixture of dimethylformamide (DMF) (Merck) and dimethyl sulfoxide (DMSO) (Merck) in a ratio of 4:1 (v/v) were introduced into a 4 mL vial: the obtained solution was stirred on a heating plate, at a temperature of 60° C., for 10 hours, obtaining a first solution. Subsequently, 112 mg of cesium iodide (TCI—Tokyo Chemical Industries) (0.431 mol) and 74.6 mg of dimethylammonium iodide (DMAI) (Merck) (0.431 mol), previously weighed inside a 1.5 mL vial, and 479 μL of said first solution were introduced into a 4 ml vial: the obtained solution was stirred on a plate, at room temperature (25° C.), for 30 minutes, obtaining a second solution. Subsequently, 237 mg of cesium iodide (TCI—Tokyo Chemical Industries) (0.912 mol) and 80.5 mg of dimethylammonium bromide (DMABr) (Greatcell Solar Materials) (0.639 mol) previously weighed inside a vial of 1.5 mL, and 1.0136 mL of said first solution were added to a 4 mL vial: the obtained solution was stirred on a plate, at room temperature (25° C.), for 30 minutes, obtaining a third solution. Subsequently, 73.6 μL of said second solution containing dimethylammonium iodide (DMAI) and 315.4 μL of said third solution containing dimethylammonium bromide (DMABr) were introduced into a 4 mL vial: the whole was mixed by means of a magnetic stirrer, at room temperature (25° C.), for 10 minutes, obtaining a perovskite-based ink containing dimethylammonium iodide (DMAI) and dimethylammonium bromide (DMABr) in a molar ratio of 25:75.

Example 4 (Disclosure)

Preparation of a Perovskite-Based Ink Containing Dimethylammonium Iodide (DMAI) and Dimethylammonium Bromide (DMABr) in a Molar Ratio of 0:100

655 mg of lead iodide (TCI—Tokyo Chemical Industries) (1.421 mol) and 1.4764 mL of a mixture of dimethylformamide (DMF) (Merck) and dimethyl sulfoxide (DMSO) (Merck) in a ratio of 4:1 (v/v) were introduced into a 4 mL vial: the obtained solution was stirred on a heating plate, at a temperature of 60° C., for 10 hours, obtaining a first solution. Subsequently, 237 mg of cesium iodide (TCI—Tokyo Chemical Industries) (0.912 mol) and 80.5 mg of dimethylammonium bromide (DMABr) (Greatcell Solar Materials) (0.639 mol) previously weighed inside a 1.5 mL vial, and 1.0136 mL of said first solution were added to a 4 mL vial: the obtained solution was stirred on a plate, at room temperature (25° C.), for 30 minutes, obtaining a perovskite-based ink containing dimethylammonium iodide (DMAI) and dimethylammonium bromide (DMABr) in a molar ratio of 0:100.

Example 5 (Comparative)

Preparation of a Perovskite-Based Ink Containing Dimethylammonium Iodide (DMAI) and Dimethylammonium Chloride (DMACl) in a Molar Ratio of 0:100

100 mg of lead iodide (TCI—Tokyo Chemical Industries) (0.2254 mol) and 0.241 mL of a mixture of dimethylformamide (DMF) (Merck) and dimethyl sulfoxide (DMSO) (Merck) in a ratio of 4:1 (v/v) were introduced into a 4 mL vial: the obtained solution was stirred on a heating plate, at a temperature of 60° C., for 10 hours, obtaining a first solution. Subsequently, 50 mg of cesium iodide (TCI—Tokyo Chemical Industries) (0.192 mol) and 15.7 mg of dimethylammonium chloride (Merck) (0.192 mol), previously weighed inside a 1.5 mL vial, and 0.2138 mL of said first solution were introduced into a 4 ml vial: the obtained solution was stirred on a plate, at room temperature (25° C.), for 30 minutes.

During stirring, the precipitation of a yellow solid was noted which makes it impossible to use the solution as an ink.

Example 6 (Comparative)

Preparation of a Perovskite Film Using the Ink Obtained in Example 1

For this purpose, a glass substrate, previously subjected to a cleaning procedure consisting in a manual cleaning, wiping with a lint-free cloth soaked in a detergent diluted with deionized water. The substrate was then rinsed with deionized water. Subsequently, the substrate was thoroughly cleaned by the following sequential methods: ultrasonic baths in (i) deionized water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was arranged in a beaker containing the solvent, placed in an ultrasonic bath, maintained at room temperature (25° C.), for a treatment of 20 minutes. After treatments (iii) and (iv), the substrate was dried with a flow of compressed nitrogen. Subsequently, the substrate was further cleaned by treatment in an ozone device (UV Ozone Cleaning System—Novasca PSD), immediately before proceeding to the next step.

The so treated substrate was ready for the deposition of the perovskite-based ink. For this purpose, 90 mL of the ink obtained in Example 1 were deposited by spin coating operating at a rotation speed equal to 3000 rpm (acceleration equal to 1000 rpm/s), for 30 seconds: the whole was subjected to thermal treatment (annealing), at 180° C., for the following times: 1 minute, 5 minutes, 10 minutes. The thickness of the obtained film was found to be equal to 450 nm.

The thickness was measured by scanning atomic force microscopy using an atomic force microscope ("TriA AFM"—APE Research) in contact mode, on an area of $20\times20$ $m^2$ with a resolution equal to 256×256 pixels.

Figure 2:
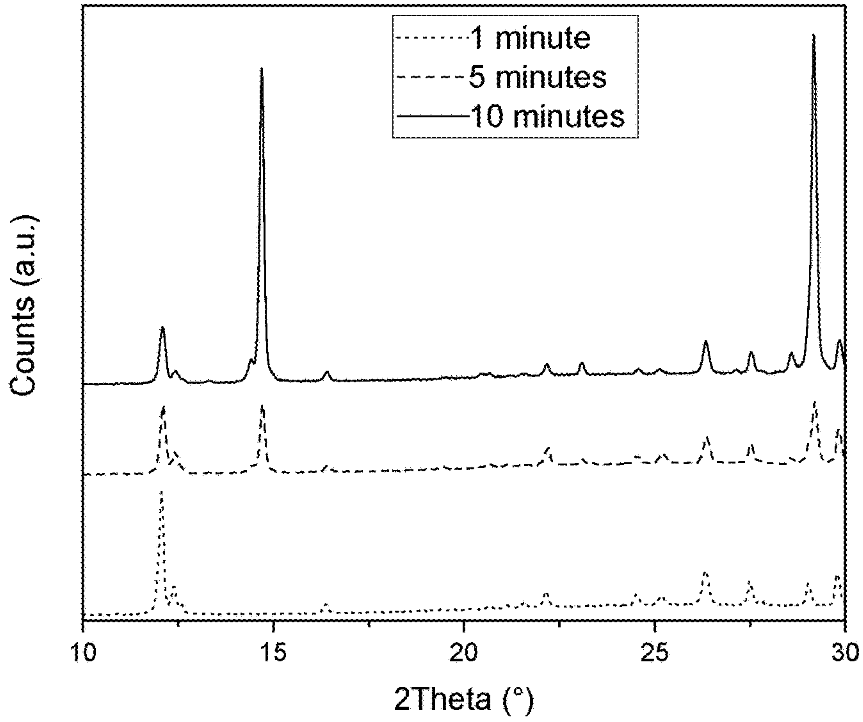

In FIG. 2 [the angle (2 Theta) in degrees (°) is shown on the abscissa; the counts in arbitrary units (a. u.) are shown on the ordinate] the X-ray diffraction patterns acquired using a Brucker D2 Phaser diffractometer using Cu Kα (λ=1,5406 Å) radiation, acquired with step of 0.02°, acquiring 1 second for each step, for the different durations of the thermal treatment (annealing). The diffraction pattern obtained after 10 minutes of thermal treatment (annealing) highlights the presence of precursors within the final material indicating an incompleteness in the reaction.

Visible absorption spectrum (520 nm-800 nm) of the obtained film was also acquired. Said spectrum was acquired in transmission using a double beam and double monochromator Perkin Elmer λ 1050+ spectrophotometer, equipped with a double deuterium and tungsten lamp, a double monochromator and a PbS Peltier photomultiplier.

Figure 3:
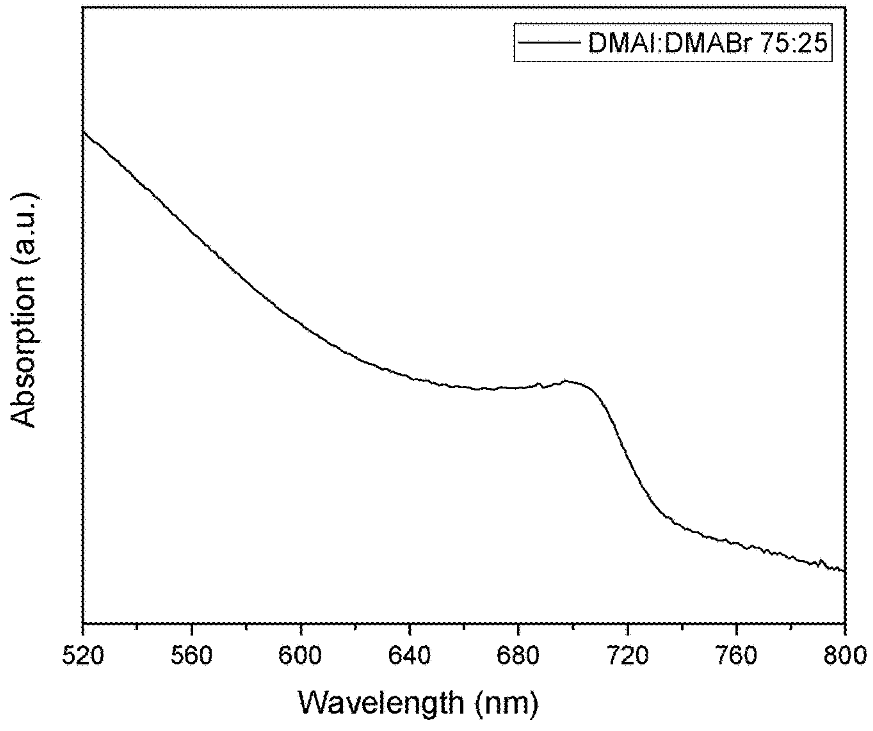

In FIG. 3 [the wavelength in nanometers (nm) is shown on the abscissa; the absorbance in arbitrary units (a. u.) is shown on the ordinate] the absorption spectrum in the visible range (520 nm-800 nm) of the obtained film is shown.

The photoluminescence spectrum of the obtained film was also acquired. Said spectrum was acquired using the optical set up reported in the article of Pica G. et al., in "Structural Dynamics" (2022), Vol. 9, 011101, doi: 10.1063/4.0000134, consisting of a PicoQuant laser excitation source at a wavelength of 470 nm, an interferometer and a single photon detector. The measurement was performed by exciting the sample with the laser beam. The photoluminescence emitted by the sample, through a system of lenses, is collimated at the input of the interferometer and the signal is directed to the single photon detector through an optical fiber. The photoluminescence spectrum was acquired in the wavelength range of 600 nm to 850 nm.

Figure 4:
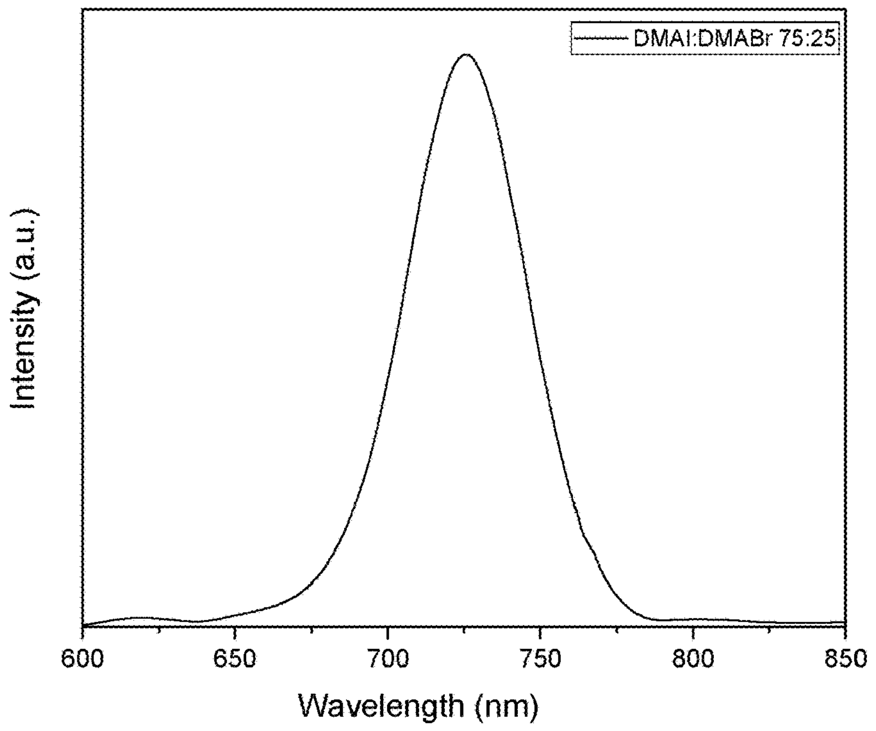

In FIG. 4 [the wavelength in nanometers (nm) is shown on the abscissa; the intensity in arbitrary units (a. u.) is shown in the ordinate] the photoluminescence spectrum (600 nm-850 nm) of the obtained film is shown.

Example 7 (Disclosure)

Preparation of a Perovskite Film Using the Ink Obtained in Example 2

For this purpose, on a glass substrate, previously subjected to the cleaning procedure reported in Example 6, 90 mL of the ink obtained in Example 2 were deposited by spin coating operating at a rotation speed equal to 3000 rpm (acceleration equal to 1000 rpm/s), for 30 seconds: the whole was subjected to thermal treatment (annealing), at 180° C., for the following times: 1 minute, 5 minutes, 10 minutes. The thickness of the obtained film was found to be equal to 450 nm.

The thickness was measured as reported in Example 6.

Figure 5:
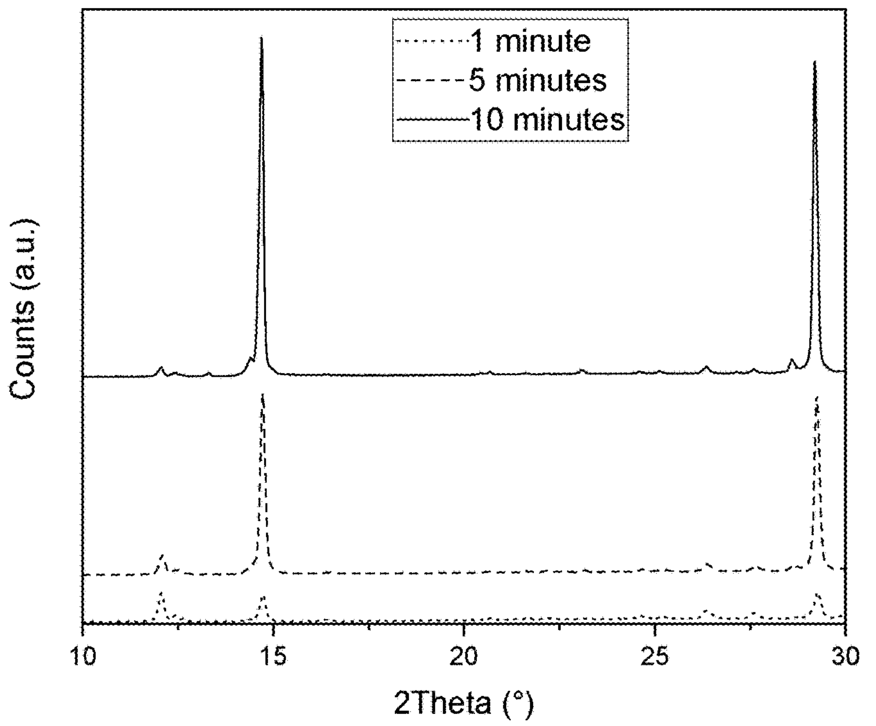

In FIG. 5 [the angle (2 Theta) in degrees (°) is shown on the abscissa; the counts in arbitrary units (a. u.) are shown on the ordinate] the X-ray diffraction patterns acquired as reported in Example 6 for the different durations of the thermal treatment (annealing) are represented. The diffraction pattern obtained after 10 minutes of thermal treatment (annealing) shows a limited presence of precursors within the final material, confirming the correct deposition of the material.

Figure 6:
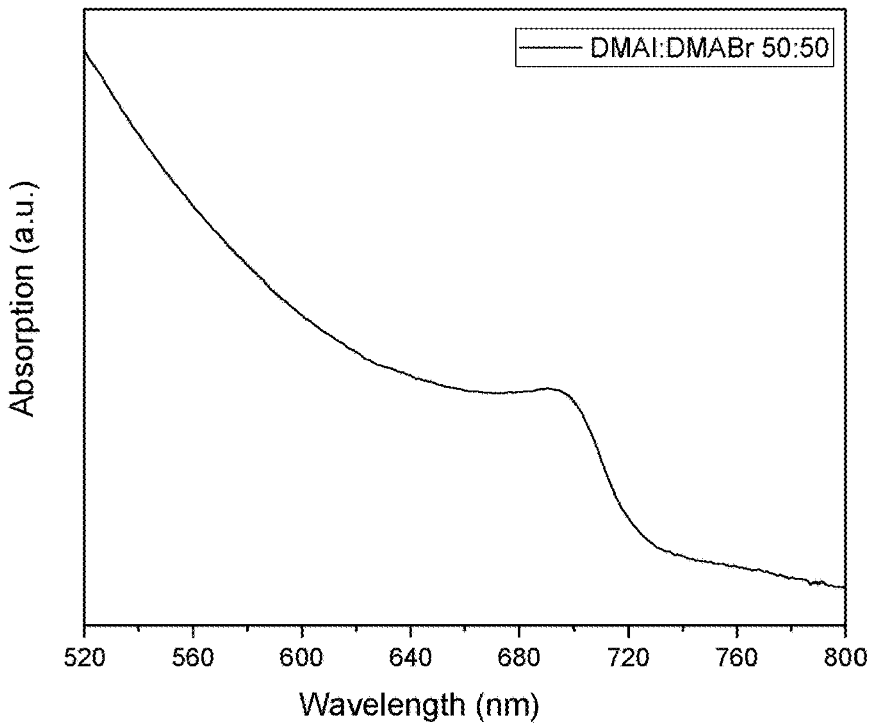

The absorption spectrum in the visible range (520 nm-800 nm) of the film obtained as reported in Example 6 was also acquired. In FIG. 6 [the wavelength in nanometers (nm) is shown on the abscissa; the absorbance in arbitrary units (a. u.) is obtained on the ordinate] the absorption spectrum in the visible range (520 nm-800 nm) of the obtained film is shown.

Figure 7:
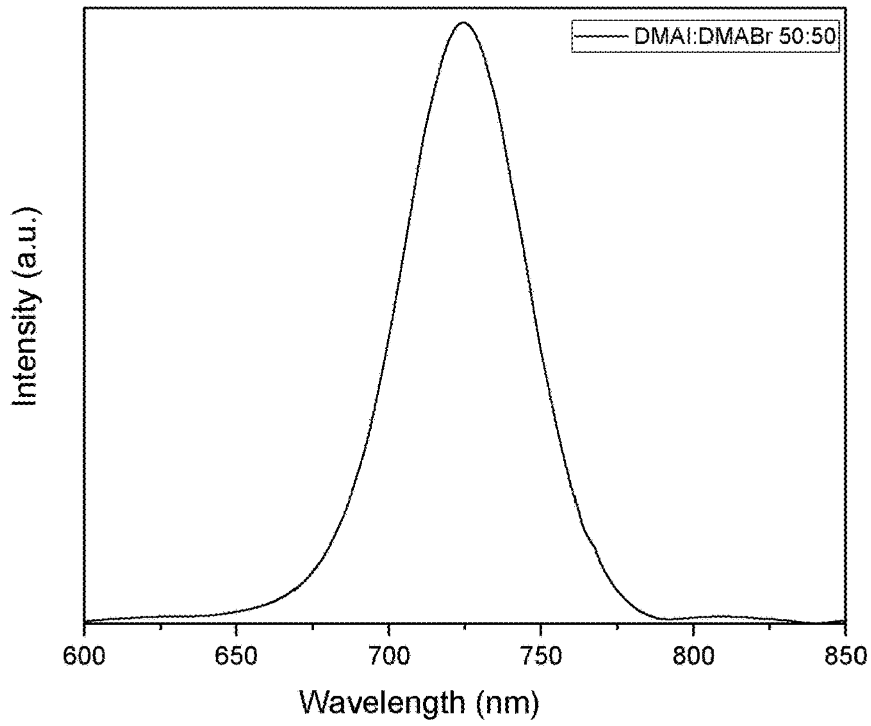

The photoluminescence spectrum of the obtained film was also acquired as reported in Example 6. In FIG. 7 [the wavelength in nanometers (nm) is shown on the abscissa; the intensity in arbitrary units (a. u.) is shown on the ordinate] the photoluminescence spectrum (600 nm-850 nm) of the obtained film is shown.

Example 8 (Disclosure)

Preparation of a Perovskite Film Using the Ink Obtained in Example 3

For this purpose, on a glass substrate, previously subjected to the cleaning procedure reported in Example 6, 90 mL of the ink obtained in Example 3 were deposited by spin coating operating at a rotation speed equal to 3000 rpm (acceleration equal to 1000 rpm/s), for 30 seconds: the whole was subjected to thermal treatment (annealing), at 180° C., for the following times: 1 minute, 5 minutes, 10 minutes. The thickness of the obtained film was found to be equal to 450 nm.

The thickness was measured as reported in Example 6.

Figure 8:
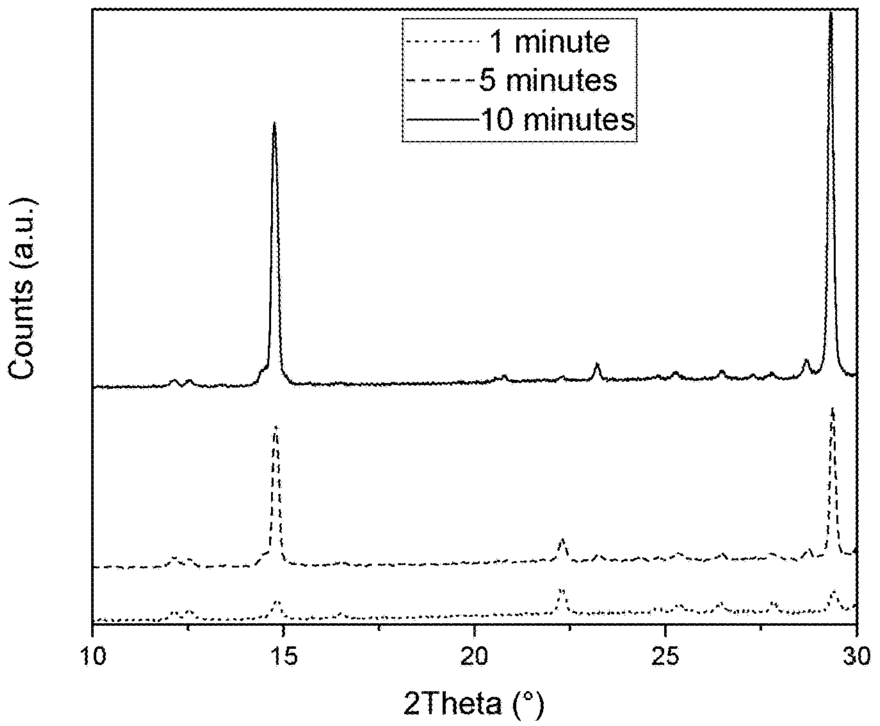

In FIG. 8 [the angle (2 Theta) in degrees (°) is shown on the abscissa; the counts in arbitrary units (a. u.) are shown on the ordinate] the X-ray diffraction patterns acquired as reported in Example 6 for the different durations of the thermal treatment (annealing) are represented. The diffraction pattern obtained after 10 minutes of thermal treatment (annealing) shows a limited presence of precursors within the final material, confirming the correct deposition of the material.

Figure 9:
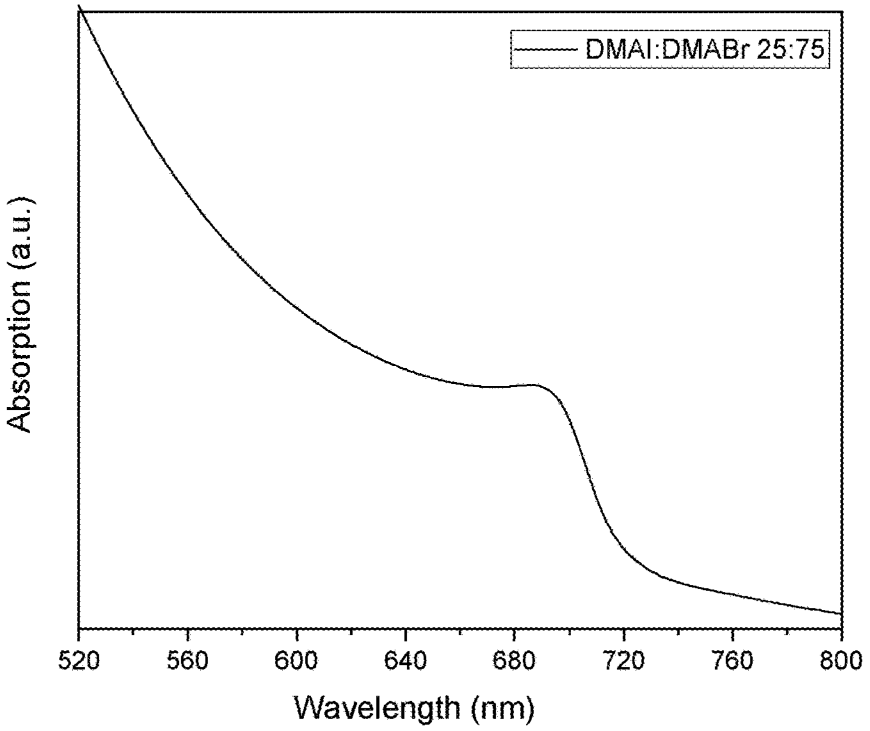

The absorption spectrum in the visible range (520 nm-800 nm) of the obtained film as reported in Example 6 was also acquired. In FIG. 9 [the wavelength in nanometers (nm) is shown on the abscissa; the absorbance in arbitrary units (a. u.) is shown on the ordinate] the absorption spectrum in the visible range (520 nm-800 nm) of the obtained film is shown.

Figure 10:
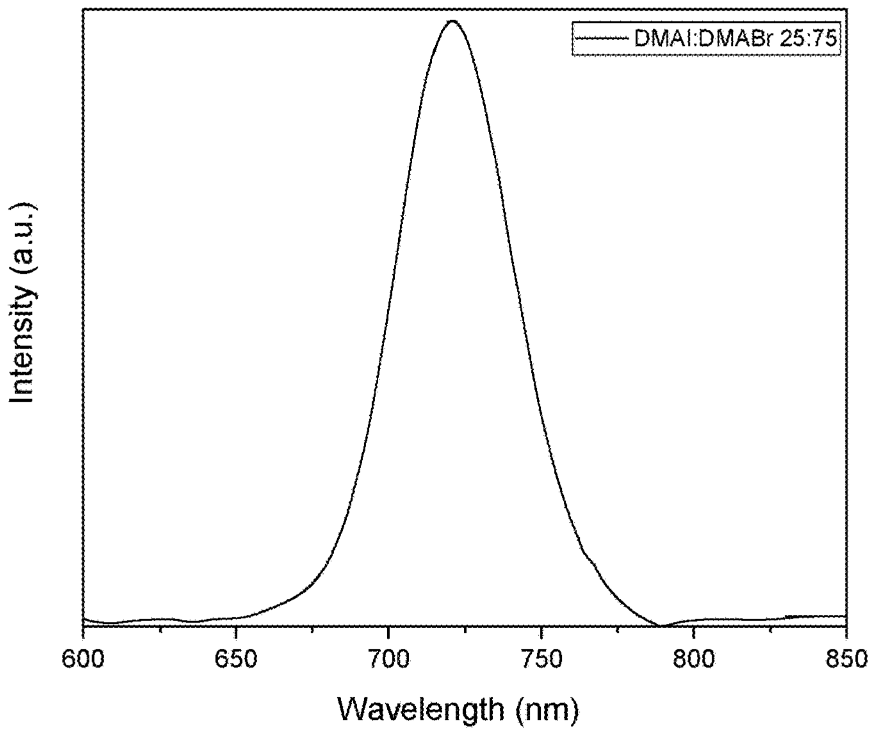

The photoluminescence spectrum of the obtained film was also acquired as reported in Example 6. In FIG. 10 [the wavelength in nanometers (nm) is shown on the abscissa; the intensity in arbitrary units (a. u.) is shown on the ordinate] the photoluminescence spectrum (600 nm-850 nm) of the obtained film is shown.

Example 9 (disclosure) Preparation of a perovskite film using the ink obtained in Example 4 For this purpose, on a glass substrate, previously subjected to the cleaning procedure reported in Example 6, 90 mL of the ink obtained in Example 4 were deposited by spin coating operating at a rotation speed equal to 3000 rpm (acceleration equal to 1000 rpm/s), for 30 seconds: the whole was subjected to thermal treatment (annealing), at 180° C., for the following times: 1 minute, 5 minutes, 10 minutes. The thickness of the obtained film was found to be equal to 450 nm.

The thickness was measured as reported in Example 6.

Figure 11:
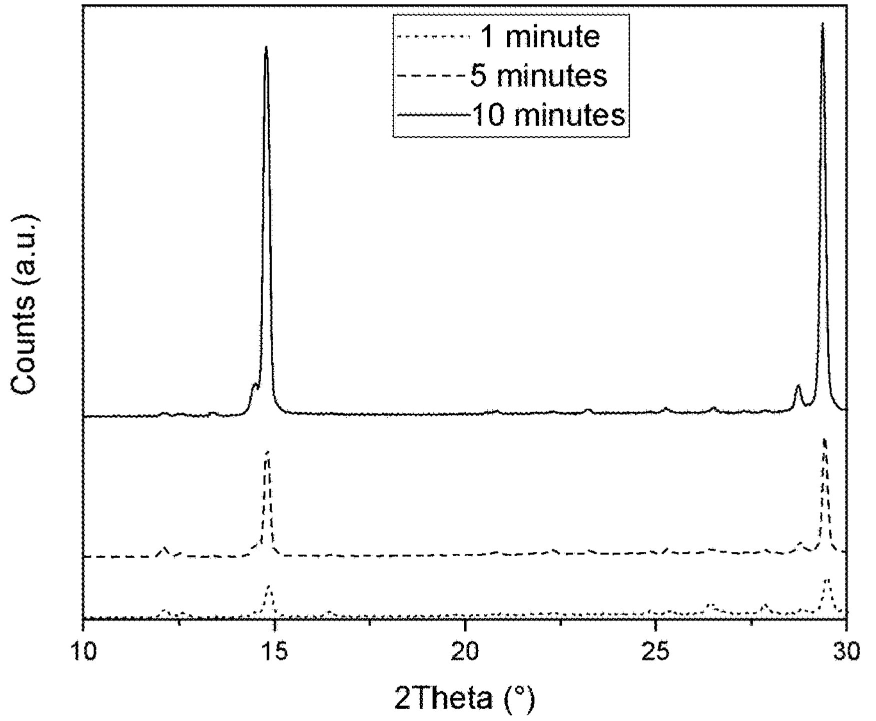

In FIG. 11 [the angle (2 Theta) in degrees (°) is shown on the abscissa; the counts in arbitrary units (a. u.) are shown on the ordinate] the X-ray diffraction patterns acquired as reported in Example 6 for the different durations of the thermal treatment (annealing) are represented. The diffraction pattern obtained after 10 minutes of thermal treatment (annealing) shows a limited presence of precursors within the final material, confirming the correct deposition of the material.

Figure 12:
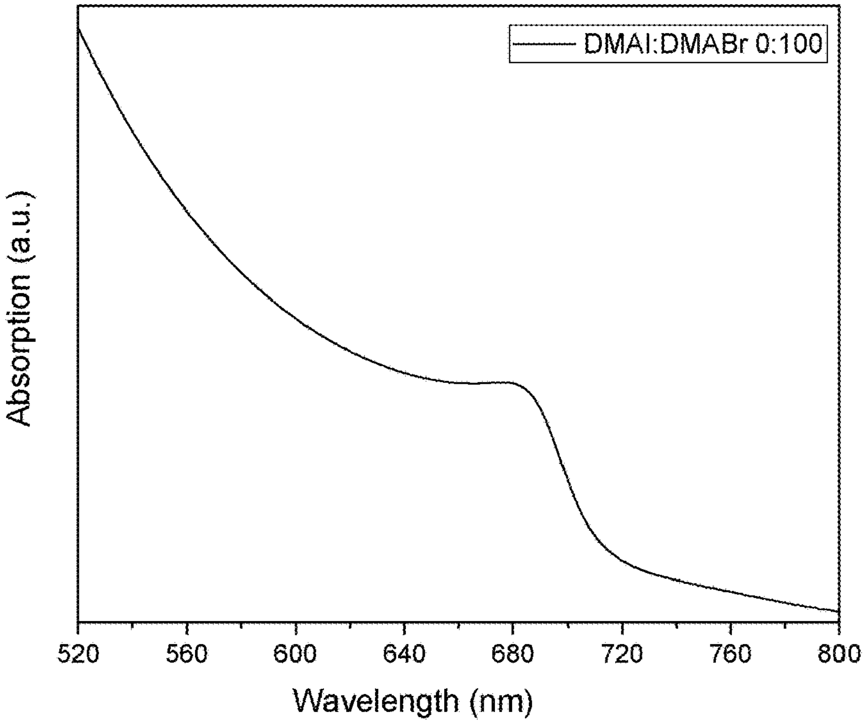

The absorption spectrum in the visible range (520 nm-800 nm) of the obtained film as reported in Example 6 was also acquired. In FIG. 12 [the wavelength in nanometers (nm) is shown on the abscissa; the absorbance in arbitrary units (a. u.) is shown on the ordinate] the absorption spectrum in the visible range (520 nm-800 nm) of the obtained film is shown.

Figure 13:
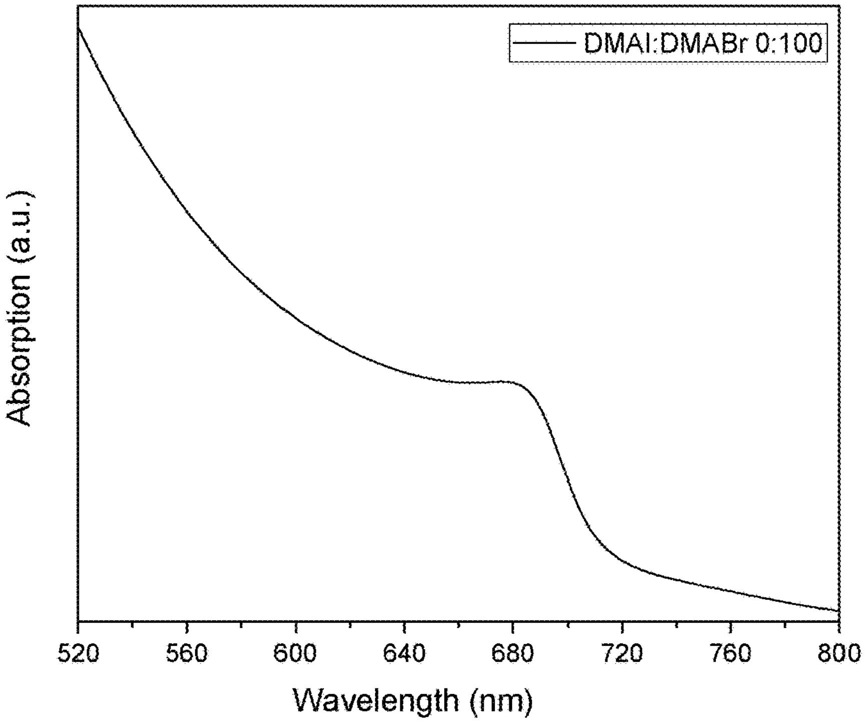

The photoluminescence spectrum of the obtained film was also acquired as reported in Example 6. In FIG. 13 [the wavelength in nanometers (nm) is shown on the abscissa; the intensity in arbitrary units (a. u.) is shown on the ordinate] the photoluminescence spectrum (600 nm-850 nm) of the obtained film is shown.

Example 10 (Comparative)

Preparation of a Perovskite-Based Solar Cell Using the Ink Obtained in Example 1

For this purpose, a perovskite-based solar cell was prepared on a glass substrate coated with FTO [fluorine-doped tin oxide ($SnO_2$:F) (Yingkou Shangneng Photoelectric Material Co. Ltd) and patterned (dimensions 29×29×1.6 mm; sheet resistance equal to 15 Ω/$cm^2$) previously subjected to a cleaning procedure consisting of manual cleaning, rubbing with a lint-free cloth soaked in a detergent diluted with deionized water. The substrate was then rinsed with deionized water. Subsequently, the substrate was thoroughly cleaned by the following sequential methods: ultrasonic baths in (i) deionized water plus detergent (followed by manual drying with a lint-free cloth); (ii) distilled water [followed by manual drying with a lint-free cloth]; (iii) acetone (Aldrich) and (iv) iso-propanol (Aldrich) in sequence. In particular, the substrate was arranged in a beaker containing the solvent, placed in an ultrasonic bath, maintained at room temperature (25° C.), for a treatment of 20 minutes. After treatments (iii) and (iv), the substrate was dried with a flow of compressed nitrogen.

Subsequently, the substrate was further cleaned by treatment in an ozone device (UV Ozone Cleaning System—Novascan PSD), immediately before proceeding to the next step.

The substrate thus treated was ready for the deposition of the electron transport layer (ETL) based on titanium dioxide ($TiO_2$). For this purpose, a solution of titanium(IV) di-iso-propoxide (Merck) (0.6 mL) and anhydrous iso-propanol (Merck) (9 mL) was prepared: said solution was deposited by spray pyrolysis at 450° C. At the end of the deposition, the whole was subjected to thermal treatment (annealing) at 450° C. for 1 hour and subsequently left to cool at room temperature (25° C.). The thickness of the compact layer of titanium dioxide (c-$TiO_2$) was found to be equal to 40 nm.

A layer of mesoporous titanium dioxide ($TiO_2$) was deposited over the layer of titanium dioxide ($TiO_2$) obtained operating as follows. For this purpose, a suspension of nanoparticles of mesoporous titanium oxide ($TiO_2$) (Merck) (1 g) in anhydrous ethanol (Merck) (8 mL) was prepared: said solution was deposited, by spin coating operating at a rotation speed of 2000 rpm (acceleration of 2000 rpm/s), for 20 seconds. The thickness of the mesoporous titanium dioxide ($TiO_2$) layer was found to be equal to 150 nm. At the end of the deposition, the whole was subjected to thermal treatment (annealing) at 500° C., for 20 minutes and subsequently subjected to cleaning again by treatment in an ozone device (UV Ozone Cleaning System—Novascan PSD), immediately before proceeding to the next step.

On top of the mesoporous titanium dioxide ($TiO_2$) layer thus obtained, the perovskite layer was deposited, i.e. 90 μl of the ink obtained in Example 1, by spin coating operating at a rotation speed of 3000 rpm (acceleration equal to 1000 rpm/s), for 30 seconds and the whole was subjected to thermal treatment (annealing), at 180° C., for 10 minutes. The thickness of the perovskite layer was found to be 450 nm.

Above the obtained perovskite layer, a layer based on a hole transport material (Hole Transport Layer—HTL) was deposited. For this purpose, 78 mg of spiro-OMeTAD ($N^2$, $N^2$,$N^{2'}$,$N^{2'}$,$N^7$,$N^7$,$N^{7'}$,$N^{7'}$-octakis(4-methoxyphenyl)-9,9'-spirobi[9H-fluorene]-2,2',7,7'-tetramine) (Merck) were dissolved in 1 ml of chlorobenzene (Merck) and, subsequently, 31 μl of 4-tert-butyl pyridine (Merck), 19 μl of a stock solution at a concentration of 517 mg/ml of lithium-bis (trifluoromethylsulfonyl)imide (Alfa Aesar) in acetonitrile (Merck) and 14 μl of a stock solution at a concentration of 376 mg/ml of cobalt-bis(trifluoromethylsulfonyl)imide (Alfa Aesar) in acetonitrile (Merck) were added to the obtained solution: the solution thus obtained was deposited, by spin coating operating at a rotation speed equal to 4000 rpm (acceleration equal to 2000 rpm/s), for 40 seconds. At the end of the deposition, the whole was left to rest, at room temperature (25° C.), for 12 hours. The thickness of the layer based on a hole transport material (Hole Transport Layer—HTL) was found to be equal to 100 nm.

The gold (Au) back contact (cathode), having a thickness equal to 80 nm, was deposited above said layer based on a hole transport material (Hole Transport Layer—HTL), by means of vacuum evaporation, suitably masking the area of the device in order to obtain an active area equal to 0.16 $cm^2$.

The deposition of the cathode was performed in a standard vacuum evaporation chamber containing the substrate and an evaporating vessel equipped with a heating element containing 10 gold (Au) shots (diameter 1 mm-3 mm). (Aldrich). The evaporation process was carried out under vacuum, at a pressure of about $1\times10^{-6}$ bar. The gold (Au), after evaporation, was condensed in the unmasked parts of the device.

The thicknesses were measured by scanning atomic force microscopy using an atomic force microscope ("TriA AFM"—APE Research) in contact mode, on an area of 20×20 $m^2$ with a resolution equal 256×256 pixels.

The electrical characterization of the perovskite-based solar cell thus obtained was carried out at room temperature (25° C.) and 30% humidity (30% RH). The photocurrent was measured by exposing the solar cell to the light of a Sinus-270 solar simulator (AAA class—Wavelabs) which provides a solar spectrum classified as AM1.5G and having an irradiance equivalent to 1 sun (100 mW/$cm^2$), placed at a distance of 36 cm from said solar cell, using an illumination spot equal to 100 mm×100 mm. Said simulator was coupled to a Keithley® 2401 digital multimeter connected to a personal computer for data collection. The current-voltage density curve (JV) was obtained by measuring the current value in a given voltage range comprised between 100 mV and 1200 mV. The measurement speed was 100 mV/s. The measurement of the current value was made by changing the acquisition direction of the curves [backward scan, i.e. from $V_{oc}$ (Open Circuit Voltage) at $J_{sc}$ (short-circuit photocurrent density) and forward scan i.e. from $J_{sc}$ (short-circuit photocurrent density) at $V_{oc}$ (Open Circuit Voltage)] and keeping the other acquisition parameters fixed. Table 1 shows the characteristic parameters as average values.

The light intensity was calibrated with a standard silicon solar cell (Centronic OSD50-0-KG5).

TABLE 1

| | $V_{oc}$ (1) (mV) | $J_{sc}$ (2) ($mA/cm^2$) | FF (3) | PCE (4) (%) |
|---|---|---|---|---|
| Forward scan | 795.95 | 8.49 | 29.28 | 1.88 |
| Backward scan | 787.57 | 8.50 | 29.30 | 1.88 |

(1) Open Circuit Voltage;
(2) short-circuit photocurrent density;
(3) Fill Factor;
(4) Power Conversion Efficiency.

Example 11 (Disclosure)

Preparation of a Perovskite-Based Solar Cell Using the Ink Obtained in Example 2

The perovskite-based solar cell was obtained using the same procedure reported in Example 10, with the only difference deriving from the use of the ink obtained in Example 2.

For this purpose, 90 µl of the ink obtained in Example 2, was deposited over the mesoporous titanium dioxide ($TiO_2$) layer by means of spin coating operating at a rotation speed of 3000 rpm (acceleration equal to 1000 rpm/s), for 30 seconds and the whole was subjected to thermal treatment (annealing), at 180° C., for 10 minutes. The thickness of the perovskite layer was found to be 450 nm.

The electrical characterization of the obtained perovskite-based solar cell was carried out as described above: in Table 2 the characteristic parameters are reported as average values.

TABLE 2

| | $V_{oc}$ (1) (mV) | $J_{sc}$ (2) ($mA/cm^2$) | FF (3) | PCE (4) (%) |
|---|---|---|---|---|
| Forward scan | 871.32 | 14.87 | 44.80 | 5.84 |
| Backward scan | 999.32 | 14.77 | 51.80 | 7.74 |

(1) Open Circuit Voltage;
(2) short-circuit photocurrent density;
(3) Fill Factor;
(4) Power Conversion Efficiency.

Example 12 (Disclosure)

Preparation of a Perovskite-Based Solar Cell Using the Ink Obtained in Example 3

The perovskite-based solar cell was obtained using the same procedure reported in Example 10, with the only difference deriving from the use of the ink obtained in Example 3.

For this purpose, 90 µl of the ink obtained in Example 3, was deposited over the mesoporous titanium dioxide ($TiO_2$) layer by means of spin coating operating at a rotation speed of 3000 rpm (acceleration equal to 1000 rpm/s), for 30 seconds and the whole was subjected to thermal treatment (annealing), at 180° C., for 10 minutes. The thickness of the perovskite layer was found to be 450 nm.

The electrical characterization of the obtained perovskite-based solar cell was carried out as described above: in Table 3 the characteristic parameters are reported as average values.

TABLE 3

| | $V_{oc}$ (1) (mV) | $J_{sc}$ (2) ($mA/cm^2$) | FF (3) | PCE (4) (%) |
|---|---|---|---|---|
| Forward scan | 942.73 | 17.51 | 46.60 | 7.90 |
| Backward scan | 1061.32 | 17.53 | 62.38 | 11.99 |

(1) Open Circuit Voltage;
(2) short-circuit photocurrent density;
(3) Fill Factor;
(4) Power Conversion Efficiency.

Example 13

Preparation of a perovskite-based solar cell using the ink obtained in Example 4

The perovskite-based solar cell was obtained using the same procedure reported in Example 10, with the only difference deriving from the use of the ink obtained in Example 4.

For this purpose, 90 µl of the ink obtained in Example 2, was deposited over the mesoporous titanium dioxide ($TiO_2$) layer by means of spin coating operating at a rotation speed of 3000 rpm (acceleration equal to 1000 rpm/s), for 30 seconds and the whole was subjected to thermal treatment (annealing), at 180° C., for 10 minutes. The thickness of the perovskite layer was found to be 450 nm.

The electrical characterization of the obtained perovskite-based solar cell was carried out as described above: in Table 4, the characteristic parameters are reported as average values.

TABLE 4

| | $V_{oc}$ (1) (mV) | $J_{sc}$ (2) ($mA/cm^2$) | FF (3) | PCE (4) (%) |
|---|---|---|---|---|
| Forward scan | 957.27 | 16.77 | 52.48 | 8.44 |
| Backward scan | 1044.69 | 16.59 | 61.90 | 10.75 |

(1) Open Circuit Voltage;
(2) short-circuit photocurrent density);
(3) Fill Factor;
(4) Power Conversion Efficiency.

The invention claimed is:

1. A process for preparing a perovskite-based ink, said comprising a perovskite of general formula (I):

$$CsPbI_{3-y}Br_y \quad (I)$$

wherein y is a number comprised between 0 and 0.2;

the process including the following steps:

(a) dissolving lead iodide ($PbI_2$) in at least one organic solvent selected from dimethyl sulfoxide (DMSO), dimethylformamide (DMF), γ-butyrolactone (GBL), or mixtures thereof, obtaining a first solution;

(b) dissolving cesium iodide (CsI) and at least one ammonium salt having general formula (II):

$$R_xH_{4-x}NI \quad (II)$$

wherein R represents a linear or branched $C_1$-$C_4$ alkyl group, in a part of said first solution obtained in step (a), obtaining a second solution;

(c) dissolving cesium iodide (CsI) and at least one ammonium salt having general formula (III):

$$R_xH_{4-x}NBr \quad (III)$$

wherein R represents a linear or branched $C_1$-$C_4$ alkyl group, in a part of said first solution obtained in step (a), obtaining a third solution;

(d) mixing said second solution obtained in step (b) with said third solution obtained in step (c), obtaining a perovskite-based ink;

wherein in said step (d), a molar ratio between said at least one ammonium salt having the general formula (II) and said at least one ammonium salt having the general formula (III) is comprised between 0:100 and 50:50.

2. The process for preparing the perovskite-based ink according to claim 1, wherein said at least one ammonium salt having the general formula (II) is dimethylammonium iodide (DMAI).

3. The process for preparing the perovskite-based ink according to claim 1, wherein said at least one ammonium salt having the general formula (III) is dimethylammonium bromide (DMABr).

4. The process for preparing the perovskite-based ink according to claim 1, wherein said step (a) is carried out:

at a temperature comprised between 30° C. and 80° C.; and/or for a time comprised between 1 hour and 12 hours.

5. The process for preparing the perovskite-based ink according to claim 1, wherein said step (b) is carried out:

at a temperature comprised between 15° C. and 35° C.; and/or for a time comprised between 5 minutes and 2 hours.

6. The process for preparing the perovskite-based ink according to claim 1, wherein said step (c) is carried out:

at a temperature comprised between 15° C. and 35° C.; and/or for a time comprised between 5 minutes and 2 hours.

7. The process for preparing the perovskite-based ink according to claim 1, wherein said step (d) is carried out:

at a temperature comprised between 15° C. and 35° C.; and/or for a time comprised between 5 minutes and 2 hours.

8. A process for preparing a perovskite film comprising the following steps:

(i) depositing the perovskite-based ink obtained by the process according to claim 1, on a substrate to form a film;

(ii) subjecting said substrate to thermal treatment at a temperature comprised between 120° C. and 190° C.

9. A process for preparing a perovskite-based photovoltaic cell comprising the following steps:

($a_1$) preparing a glass substrate covered with a transparent and conductive oxide layer;

($b_1$) depositing a layer based on an electron transport material;

($c_1$) optionally, depositing on the layer based on the electron transport material obtained in said step ($b_1$), a layer based on a mesoporous oxide;

($d_1$) depositing the perovskite-based ink obtained by the process according to claim 1, on the layer based on the electron transport material obtained in said step ($b_1$), or on the layer based on the mesoporous oxide obtained in said step ($c_1$), obtaining a photoactive layer;

($e_1$) depositing a layer based on a hole transport material on the photoactive layer obtained in said step ($d_1$);

($f_1$) depositing a metallic contact which constitutes a cathode on the layer based on the hole transport material obtained in said step ($e_1$);

wherein said step ($d_1$) is carried out at a temperature comprised between 120° C. and 190° C.

* * * * *